(12) United States Patent
Millward

(10) Patent No.: US 9,177,794 B2
(45) Date of Patent: Nov. 3, 2015

(54) METHODS OF PATTERNING SUBSTRATES

(75) Inventor: Dan Millward, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 215 days.

(21) Appl. No.: 13/350,136

(22) Filed: Jan. 13, 2012

(65) Prior Publication Data

US 2013/0183827 A1     Jul. 18, 2013

(51) Int. Cl.
| | | |
|---|---|---|
| *H01L 21/311* | (2006.01) | |
| *H01L 21/027* | (2006.01) | |
| *H01L 21/312* | (2006.01) | |
| *H01L 21/033* | (2006.01) | |

(52) U.S. Cl.
CPC ........ *H01L 21/0273* (2013.01); *H01L 21/0337* (2013.01); *H01L 21/312* (2013.01); *H01L 21/31133* (2013.01); *H01L 21/31138* (2013.01)

(58) Field of Classification Search
CPC .............. H01L 21/0273; H01L 21/312; H01L 21/31133; H01L 21/0337; B81C 1/00031
USPC ................. 438/696, 708, 725; 216/41, 46, 49
See application file for complete search history.

(56) References Cited

U.S. PATENT DOCUMENTS

| | | |
|---|---|---|
| 4,910,168 A | 3/1990 | Tsai |
| 5,008,207 A | 4/1991 | Blouse et al. |
| 5,013,680 A | 5/1991 | Lowrey et al. |
| 5,047,117 A | 9/1991 | Roberts |
| 5,254,218 A | 10/1993 | Roberts et al. |
| 5,328,810 A | 7/1994 | Lowrey et al. |
| 5,372,916 A | 12/1994 | Ogawa et al. |
| 5,382,315 A | 1/1995 | Kumar |
| 5,420,067 A | 5/1995 | Hsu |
| 5,429,988 A | 7/1995 | Huang et al. |
| 5,573,837 A | 11/1996 | Roberts et al. |

(Continued)

FOREIGN PATENT DOCUMENTS

| | | |
|---|---|---|
| CN | 1550889 | 12/2004 |
| CN | 1752844 | 3/2006 |

(Continued)

OTHER PUBLICATIONS 0.1 μm Level Contact Hole Pattern Formation with KrF Lithography by Resolution Enhancement Lithography Assisted by Chemical Shrink (RELACS); Toyoshima et al.; IEEE; 1998; pp. 12.5.1-12.5.4.

(Continued)

*Primary Examiner* — Binx X Tran
(74) *Attorney, Agent, or Firm* — Wells St. John, PS

(57) ABSTRACT

A method of patterning a substrate includes forming spaced first features over a substrate. Individual of the spaced first features include sidewall portions of different composition than material that is laterally between the sidewall portions. A mixture of immiscible materials is provided between the spaced first features. At least two of the immiscible materials are laterally separated along at least one elevation between adjacent spaced first features. The laterally separating forms a laterally intermediate region including one of the immiscible materials between two laterally outer regions including another of the immiscible materials along the one elevation. The laterally outer regions are removed and material of the spaced first features is removed between the sidewall portions to form spaced second features over the substrate. Other embodiments are disclosed.

23 Claims, 6 Drawing Sheets

(56) References Cited

U.S. PATENT DOCUMENTS

| | | |
|---|---|---|
| 5,593,813 A | 1/1997 | Kim |
| 5,616,510 A | 4/1997 | Wong |
| 5,905,279 A | 5/1999 | Nitayama et al. |
| 5,916,821 A | 6/1999 | Kerber |
| 6,063,688 A | 5/2000 | Doyle et al. |
| 6,087,263 A | 7/2000 | Clampitt et al. |
| 6,140,217 A | 10/2000 | Jones et al. |
| 6,174,818 B1 | 1/2001 | Tao et al. |
| 6,207,490 B1 | 3/2001 | Lee |
| 6,235,574 B1 | 5/2001 | Tobben et al. |
| 6,249,335 B1 | 6/2001 | Hirukawa et al. |
| 6,303,272 B1 | 10/2001 | Furukawa et al. |
| 6,352,932 B1 | 3/2002 | Clampitt et al. |
| 6,383,952 B1 | 5/2002 | Subramanian et al. |
| 6,429,123 B1 | 8/2002 | Tseng |
| 6,483,136 B1 | 11/2002 | Yoshida et al. |
| 6,545,904 B2 | 4/2003 | Tran |
| 6,548,385 B1 | 4/2003 | Lai |
| 6,548,401 B1 | 4/2003 | Trivedi |
| 6,566,280 B1 | 5/2003 | Meagley et al. |
| 6,580,136 B2 | 6/2003 | Mandelman et al. |
| 6,599,844 B2 | 7/2003 | Koh et al. |
| 6,605,541 B1 | 8/2003 | Yu |
| 6,627,524 B2 | 9/2003 | Scott |
| 6,630,379 B2 | 10/2003 | Mandelman et al. |
| 6,638,441 B2 | 10/2003 | Chang et al. |
| 6,649,956 B2 | 11/2003 | Yoshida et al. |
| 6,667,502 B1 | 12/2003 | Agarwal et al. |
| 6,703,323 B2 | 3/2004 | Kong et al. |
| 6,710,390 B2 | 3/2004 | Parekh et al. |
| 6,734,107 B2 | 5/2004 | Lai et al. |
| 6,735,132 B2 | 5/2004 | Siek |
| 6,753,220 B2 | 6/2004 | Juengling |
| 6,756,619 B2 | 6/2004 | Tran |
| 6,774,051 B2 | 8/2004 | Chung et al. |
| 6,811,817 B2 | 11/2004 | Sugeta et al. |
| 6,826,069 B2 | 11/2004 | Kurjanowicz et al. |
| 6,864,184 B1 | 3/2005 | Gabriel |
| 6,872,512 B2 | 3/2005 | Yamashita |
| 6,893,972 B2 | 5/2005 | Rottstegge et al. |
| 6,905,975 B2 | 6/2005 | Boettiger et al. |
| 6,916,594 B2 | 7/2005 | Bok et al. |
| 6,951,822 B2 | 10/2005 | Scholz |
| 6,977,404 B2 | 12/2005 | Katsumata et al. |
| 7,023,069 B2 | 4/2006 | Blanchard |
| 7,037,840 B2 | 5/2006 | Katz |
| 7,042,038 B2 | 5/2006 | Yoshida et al. |
| 7,049,652 B2 | 5/2006 | Mokhlesi et al. |
| 7,064,376 B2 | 6/2006 | Shau |
| 7,067,385 B2 | 6/2006 | Manning |
| 7,074,533 B2 | 7/2006 | Fuller et al. |
| 7,098,105 B2 | 8/2006 | Juengling |
| 7,115,525 B2 | 10/2006 | Abatchev et al. |
| 7,125,781 B2 | 10/2006 | Manning et al. |
| 7,151,040 B2 | 12/2006 | Tran et al. |
| 7,166,533 B2 | 1/2007 | Happ |
| 7,199,005 B2 | 4/2007 | Sandhu et al. |
| 7,202,127 B2 | 4/2007 | Busch et al. |
| 7,202,174 B1 | 4/2007 | Jung et al. |
| 7,230,292 B2 | 6/2007 | Graettinger |
| 7,253,118 B2 | 8/2007 | Tran et al. |
| 7,265,059 B2 | 9/2007 | Rao et al. |
| 7,271,108 B2 | 9/2007 | Sadjadi |
| 7,314,810 B2 | 1/2008 | Jung et al. |
| 7,320,911 B2 | 1/2008 | Basceri et al. |
| 7,339,252 B2 | 3/2008 | Blanchard |
| 7,361,609 B2 | 4/2008 | Hah et al. |
| 7,384,849 B2 | 6/2008 | Parekh et al. |
| 7,387,939 B2 | 6/2008 | Manning |
| 7,390,749 B2 | 6/2008 | Kim et al. |
| 7,390,750 B1 | 6/2008 | Ramkumar et al. |
| 7,396,781 B2 | 7/2008 | Wells |
| 7,439,152 B2 | 10/2008 | Manning |
| 7,442,976 B2 | 10/2008 | Juengling |
| 7,517,753 B2 | 4/2009 | Manning |
| 7,521,371 B2 | 4/2009 | DeBruler |
| 7,521,378 B2 | 4/2009 | Fucsko et al. |
| 7,524,607 B2 | 4/2009 | Ho et al. |
| 7,537,866 B2 | 5/2009 | King Liu |
| 7,544,563 B2 | 6/2009 | Manning |
| 7,553,760 B2 | 6/2009 | Yang et al. |
| 7,557,013 B2 | 7/2009 | Bhat et al. |
| 7,557,015 B2 | 7/2009 | Sandhu et al. |
| 7,582,412 B2 | 9/2009 | Cameron et al. |
| 7,682,924 B2 | 3/2010 | Bhat et al. |
| 7,687,387 B2 | 3/2010 | Inaba et al. |
| 7,696,076 B2 | 4/2010 | Jung et al. |
| 7,713,818 B2 | 5/2010 | Chan |
| 7,754,591 B2 | 7/2010 | Jung |
| 7,790,357 B2 | 9/2010 | Jung |
| 7,790,360 B2 | 9/2010 | Alapati et al. |
| 7,807,575 B2 | 10/2010 | Zhou |
| 7,842,601 B2 | 11/2010 | Lee et al. |
| 7,846,646 B2 | 12/2010 | Kamijima |
| 7,851,135 B2 | 12/2010 | Jung et al. |
| 7,855,038 B2 | 12/2010 | Hah et al. |
| 7,897,460 B2 | 3/2011 | Parekh et al. |
| 7,923,371 B2 | 4/2011 | Shinohe |
| 8,083,953 B2 | 12/2011 | Millward et al. |
| 8,083,958 B2 | 12/2011 | Li et al. |
| 8,148,052 B2 | 4/2012 | Vanleenhove et al. |
| 8,338,304 B2 | 12/2012 | Zhou |
| 8,440,576 B2 | 5/2013 | Hong |
| 8,629,048 B1 | 1/2014 | Sipani et al. |
| 8,629,527 B2 | 1/2014 | Parekh et al. |
| 2002/0037617 A1 | 3/2002 | Kim et al. |
| 2002/0043690 A1 | 4/2002 | Doyle et al. |
| 2002/0094688 A1 | 7/2002 | Mitsuiki |
| 2002/0130348 A1 | 9/2002 | Tran |
| 2003/0001214 A1 | 1/2003 | Yoshida et al. |
| 2003/0006410 A1 | 1/2003 | Doyle |
| 2003/0008968 A1 | 1/2003 | Sugeta et al. |
| 2003/0091936 A1 | 5/2003 | Rottstegge et al. |
| 2003/0096903 A1 | 5/2003 | Sugeta et al. |
| 2004/0043546 A1 | 3/2004 | Yoshida et al. |
| 2004/0198065 A1 | 10/2004 | Lee et al. |
| 2004/0253535 A1 | 12/2004 | Cameron et al. |
| 2005/0058950 A1 | 3/2005 | Sugeta et al. |
| 2005/0130068 A1 | 6/2005 | Kondoh et al. |
| 2005/0142497 A1 | 6/2005 | Ryou et al. |
| 2005/0164478 A1 | 7/2005 | Chan et al. |
| 2005/0173740 A1 | 8/2005 | Jin |
| 2005/0214683 A1 | 9/2005 | Nishimura et al. |
| 2005/0215040 A1 | 9/2005 | Doyle |
| 2005/0255696 A1 | 11/2005 | Makiyama et al. |
| 2005/0272220 A1 | 12/2005 | Waldfried et al. |
| 2006/0011947 A1 | 1/2006 | Juengling |
| 2006/0024621 A1 | 2/2006 | Nolscher et al. |
| 2006/0046200 A1 | 3/2006 | Abatchev et al. |
| 2006/0046422 A1 | 3/2006 | Tran et al. |
| 2006/0046484 A1 | 3/2006 | Abatchev et al. |
| 2006/0063384 A1 | 3/2006 | Hah et al. |
| 2006/0088788 A1 | 4/2006 | Kudo et al. |
| 2006/0099347 A1 | 5/2006 | Sugeta et al. |
| 2006/0115978 A1 | 6/2006 | Specht et al. |
| 2006/0118785 A1 | 6/2006 | Allen et al. |
| 2006/0154182 A1 | 7/2006 | Brodsky |
| 2006/0240361 A1 | 10/2006 | Lee et al. |
| 2006/0262511 A1 | 11/2006 | Abatchev et al. |
| 2006/0263699 A1 | 11/2006 | Abatchev et al. |
| 2006/0273456 A1 | 12/2006 | Sant et al. |
| 2006/0278911 A1 | 12/2006 | Eppich |
| 2006/0281266 A1 | 12/2006 | Wells |
| 2006/0286795 A1 | 12/2006 | Yosho |
| 2007/0003878 A1 | 1/2007 | Paxton et al. |
| 2007/0010058 A1 | 1/2007 | Juengling |
| 2007/0020565 A1 | 1/2007 | Koh et al. |
| 2007/0023805 A1 | 2/2007 | Wells et al. |
| 2007/0026684 A1 | 2/2007 | Parascandola et al. |
| 2007/0037066 A1 | 2/2007 | Hsiao |
| 2007/0045712 A1 | 3/2007 | Haller et al. |
| 2007/0048674 A1 | 3/2007 | Wells |
| 2007/0048930 A1 | 3/2007 | Figura et al. |
| 2007/0049003 A1 | 3/2007 | Smythe |

(56) References Cited

U.S. PATENT DOCUMENTS

| | | |
|---|---|---|
| 2007/0049011 A1 | 3/2007 | Tran |
| 2007/0049030 A1 | 3/2007 | Sandhu et al. |
| 2007/0049035 A1 | 3/2007 | Tran |
| 2007/0049040 A1 | 3/2007 | Bai et al. |
| 2007/0077524 A1 | 4/2007 | Koh et al. |
| 2007/0077743 A1 | 4/2007 | Rao et al. |
| 2007/0085152 A1 | 4/2007 | Butler et al. |
| 2007/0096182 A1 | 5/2007 | Schloesser et al. |
| 2007/0099431 A1 | 5/2007 | Li |
| 2007/0105357 A1 | 5/2007 | Nejad et al. |
| 2007/0123015 A1 | 5/2007 | Chinthakindi et al. |
| 2007/0145464 A1 | 6/2007 | Voshell et al. |
| 2007/0148984 A1 | 6/2007 | Abatchev et al. |
| 2007/0161251 A1 | 7/2007 | Tran et al. |
| 2007/0181929 A1 | 8/2007 | Juengling |
| 2007/0190463 A1 | 8/2007 | Sandhu et al. |
| 2007/0197014 A1 | 8/2007 | Jeon et al. |
| 2007/0202671 A1 | 8/2007 | Jung |
| 2007/0202697 A1 | 8/2007 | Jung |
| 2007/0205438 A1 | 9/2007 | Juengling |
| 2007/0205443 A1 | 9/2007 | Juengling |
| 2007/0224537 A1 | 9/2007 | Nozaki et al. |
| 2007/0238053 A1 | 10/2007 | Hashimoto |
| 2007/0238299 A1 | 10/2007 | Niroomand et al. |
| 2007/0248916 A1 | 10/2007 | Kamijima |
| 2007/0261016 A1 | 11/2007 | Sandhu et al. |
| 2007/0264828 A1 | 11/2007 | Jung et al. |
| 2007/0264830 A1 | 11/2007 | Huang et al. |
| 2007/0278183 A1 | 12/2007 | Lee et al. |
| 2007/0281219 A1 | 12/2007 | Sandhu |
| 2007/0281488 A1 | 12/2007 | Wells et al. |
| 2007/0281493 A1 | 12/2007 | Fucsko et al. |
| 2008/0002475 A1 | 1/2008 | Yang et al. |
| 2008/0008969 A1 | 1/2008 | Zhou et al. |
| 2008/0026327 A1 | 1/2008 | Koo |
| 2008/0032243 A1 | 2/2008 | Jung |
| 2008/0032508 A1 | 2/2008 | Chang |
| 2008/0044770 A1 | 2/2008 | Nozaki et al. |
| 2008/0057692 A1 | 3/2008 | Wells et al. |
| 2008/0063986 A1 | 3/2008 | Jung |
| 2008/0064213 A1 | 3/2008 | Jung |
| 2008/0070165 A1 | 3/2008 | Fischer et al. |
| 2008/0076070 A1 | 3/2008 | Koh et al. |
| 2008/0085612 A1 | 4/2008 | Smythe et al. |
| 2008/0090416 A1 | 4/2008 | Raghu et al. |
| 2008/0113483 A1 | 5/2008 | Wells |
| 2008/0113511 A1 | 5/2008 | Park et al. |
| 2008/0122125 A1 | 5/2008 | Zhou |
| 2008/0171438 A1 | 7/2008 | Sinha et al. |
| 2008/0171446 A1 | 7/2008 | Kim et al. |
| 2008/0176152 A1 | 7/2008 | Hah et al. |
| 2008/0176406 A1 | 7/2008 | Ikeda et al. |
| 2008/0193658 A1* | 8/2008 | Millward ............ 427/401 |
| 2008/0199806 A1 | 8/2008 | Hatakeyama et al. |
| 2008/0199814 A1 | 8/2008 | Brzozowy et al. |
| 2008/0206950 A1 | 8/2008 | Bhat et al. |
| 2008/0210900 A1 | 9/2008 | Wojtczak et al. |
| 2008/0220600 A1 | 9/2008 | Alapati et al. |
| 2008/0254627 A1 | 10/2008 | Wells |
| 2008/0261349 A1 | 10/2008 | Abatchev et al. |
| 2008/0292991 A1 | 11/2008 | Wallow et al. |
| 2008/0296732 A1 | 12/2008 | Olson |
| 2008/0305636 A1 | 12/2008 | Kim et al. |
| 2009/0074958 A1 | 3/2009 | Xiao |
| 2009/0108415 A1 | 4/2009 | Lenski et al. |
| 2009/0117739 A1 | 5/2009 | Shin et al. |
| 2009/0130601 A1 | 5/2009 | Jeon |
| 2009/0130612 A1 | 5/2009 | Yang |
| 2009/0130852 A1 | 5/2009 | Kewley |
| 2009/0212016 A1 | 8/2009 | Cheng et al. |
| 2009/0214823 A1* | 8/2009 | Cheng et al. ............ 428/137 |
| 2009/0291397 A1 | 11/2009 | DeVilliers |
| 2009/0298274 A1 | 12/2009 | Kajiwara |
| 2010/0009512 A1 | 1/2010 | Fishburn |
| 2010/0021573 A1 | 1/2010 | Gonzalez et al. |
| 2010/0028809 A1 | 2/2010 | Vanleenhove et al. |
| 2010/0040980 A1 | 2/2010 | Nishimura et al. |
| 2010/0068656 A1 | 3/2010 | Yeh et al. |
| 2010/0081265 A1 | 4/2010 | Mashita et al. |
| 2010/0093175 A1* | 4/2010 | Niroomand et al. .......... 438/694 |
| 2010/0124826 A1* | 5/2010 | Millward et al. ............ 438/780 |
| 2010/0129980 A1* | 5/2010 | Sandhu et al. ............... 438/422 |
| 2010/0130015 A1 | 5/2010 | Nakajima et al. |
| 2010/0130016 A1 | 5/2010 | DeVilliers |
| 2010/0144150 A1 | 6/2010 | Sills et al. |
| 2010/0144151 A1 | 6/2010 | Sills et al. |
| 2010/0144153 A1 | 6/2010 | Sills et al. |
| 2010/0203740 A1 | 8/2010 | Li |
| 2011/0018055 A1 | 1/2011 | Ohta et al. |
| 2011/0127677 A1 | 6/2011 | Konishi |
| 2011/0147984 A1* | 6/2011 | Cheng et al. .................. 264/220 |
| 2013/0009283 A1 | 1/2013 | Zhou |
| 2013/0078574 A1* | 3/2013 | Peeters et al. ............. 430/285.1 |

FOREIGN PATENT DOCUMENTS

| | | |
|---|---|---|
| CN | 1761063 | 4/2006 |
| CN | 101026087 | 8/2007 |
| CN | 101145515 | 3/2008 |
| CN | 200980148546.9 | 11/2012 |
| CN | 200980148548.8 | 2/2013 |
| CN | 200980148590.X | 2/2013 |
| CN | 201080013110.1 | 5/2013 |
| EP | 0171111 | 2/1986 |
| EP | 1273974 A2 | 1/2003 |
| EP | 09830819 | 3/2013 |
| EP | 10756541 | 5/2013 |
| EP | 09743197 | 6/2013 |
| EP | 09830818.2 | 7/2013 |
| EP | 09830820 | 8/2013 |
| JP | 56046531 | 4/1981 |
| JP | 58157135 | 9/1983 |
| JP | 59211231 | 11/1984 |
| JP | 64035916 | 3/1989 |
| JP | 1292829 | 11/1989 |
| JP | 3270227 | 12/1991 |
| JP | 06-077180 | 3/1994 |
| JP | 6275577 | 9/1994 |
| JP | 2002-217170 | 8/2002 |
| JP | 2003234279 | 8/2003 |
| JP | 2004134574 | 4/2004 |
| JP | 2004247399 | 9/2004 |
| JP | 2005-243681 | 9/2005 |
| JP | 2006245625 | 9/2006 |
| JP | 2007017993 | 1/2007 |
| JP | 2007-294511 | 11/2007 |
| JP | 2007305976 | 11/2007 |
| JP | 2008-072097 | 3/2008 |
| JP | 2009-0289974 | 12/2009 |
| KR | 20030049198 | 6/2003 |
| KR | 20030056601 | 7/2003 |
| KR | 20030089063 | 11/2003 |
| KR | 10-2004-0016678 | 2/2004 |
| KR | 4025289 | 3/2004 |
| KR | 20040057582 | 7/2004 |
| KR | 10-2007-0076793 | 7/2007 |
| KR | 10-2007-0122049 | 12/2007 |
| KR | 10-0784062 | 12/2007 |
| KR | 10-2008-0039006 | 5/2008 |
| KR | 20080038963 | 5/2008 |
| SG | 201300853-7 | 6/2013 |
| TW | 200702903 | 1/2007 |
| TW | 200818405 | 4/2008 |
| TW | 200834660 | 8/2008 |
| TW | 098113229 | 9/2012 |
| TW | 098139941 | 12/2012 |
| TW | 098139943 | 12/2012 |
| TW | 099140232 | 7/2013 |
| TW | 098139942 | 12/2013 |
| WO | PCT/US2007/015729 | 1/2001 |
| WO | WO 2006/104654 | 10/2006 |
| WO | WO 2007/027558 | 3/2007 |
| WO | PCT/US2007/015729 | 1/2008 |
| WO | WO 2008/008338 | 1/2008 |

(56) References Cited

FOREIGN PATENT DOCUMENTS

| WO | WO 2008/059440 | 5/2008 |
|---|---|---|
| WO | PCT/US2009/039793 | 10/2009 |
| WO | PCT/US2009/041500 | 12/2009 |
| WO | PCT/US2009/063978 | 5/2010 |
| WO | PCT/US2009/063999 | 5/2010 |
| WO | PCT/US2009/064004 | 5/2010 |
| WO | PCT/US2010/025495 | 9/2010 |
| WO | PCT/US2009/039793 | 11/2010 |
| WO | PCT/US2009/041500 | 12/2010 |
| WO | PCT/US2009/063978 | 6/2011 |
| WO | PCT/US2009/063999 | 6/2011 |
| WO | PCT/US2009/064004 | 6/2011 |
| WO | PCT/US2010/055488 | 6/2011 |
| WO | PCT/US2010/025495 | 9/2011 |

OTHER PUBLICATIONS

U.S. Appl. No. 11/714,378, PreliminaryAmen, filed Mar. 5, 2007, Alapati et al.

U.S. Appl. No. 13/101,485, filed May 5, 2011, Light et al.

Clariant, Polysilazane SODs Spinful 400 Series for STI/PMD Application; Oct. 19, 2009; 1 pp.

Ee et al., "Innovative Solutions to Enhance the Legacy Equipments Towards One Generation Ahead in Flip Chip BGA 0.8mm Ball Pitch Technology", Sep. 2005; 4 pp.

Fritze et al., "Enhanced Resosulation for Future Fabrication", Jan. 2003, 5 pp.

Gallia et al., "A Flexible Gate Array Architecture for High-speed and High-Density Applications", Mar. 1996, pp. 430-436.

Hori et al., "Sub-40nm Half-Pitch Double Patterning with Resist Freezing Process", 2008 8 pp.

Lee et al., "Double-Patterning Technique Using Plasma Treatment of Photoresist", Sep. 20, 2007, 5 pp.

Liau et al., "Softbake and Post-exposure Bake Optimization for Process Window Improvement and Optical Proximity Effect Tuning", 2006, 7 pp.

Lu, "Advanced Cell Structuresw for Dynamic RAMs", Jan. 1989, pp. 27-36.

Ma, "Plasma Resist Image Stabilization Technique (PRIST)", 1980, 2 pp.

Owa et al., "Immersion Lithography Ready for 45nm Manufacturing and Beyond", 2007, pp. 238-244.

Pease et al., "Lithography and Other Patterning Techniques for Future Electronics", Feb. 2008, pp. 248-270.

Tan et al., "Current Status of Nanonex Nanoimprint Solutions", 2004, 9 pp.

Terai et al., "Newly developed RELACS Process and materials for 64 nm node device and beyond", pp. 20-21.

\* cited by examiner

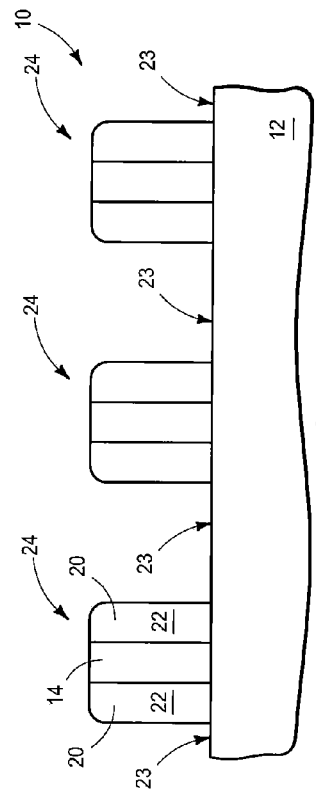
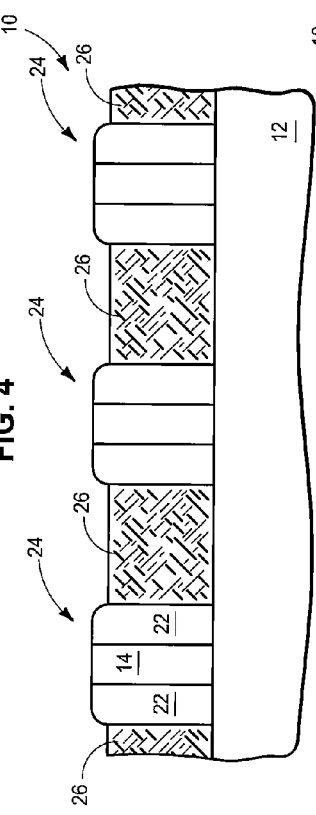
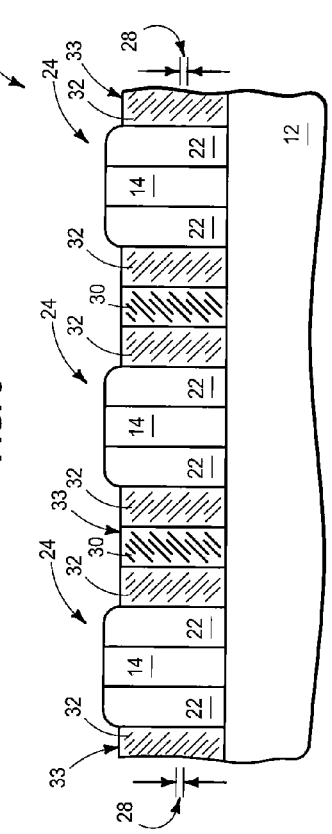
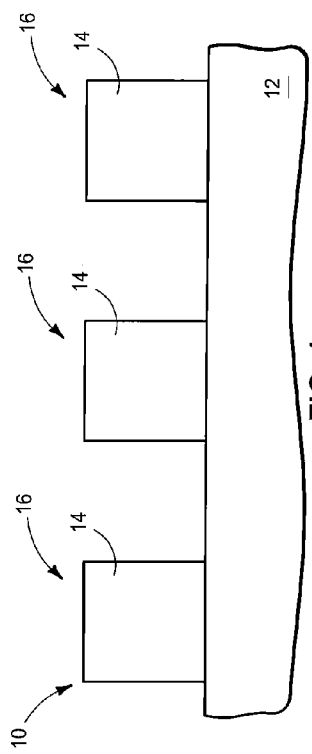
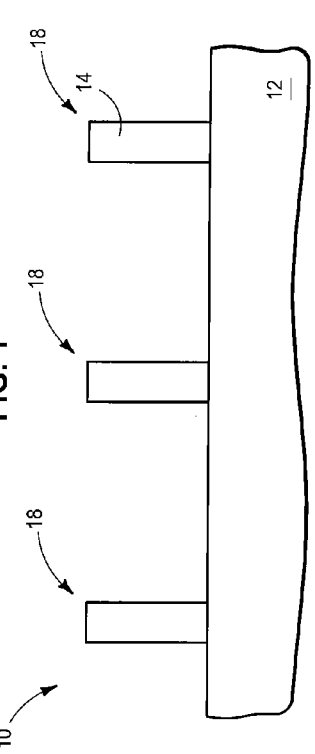
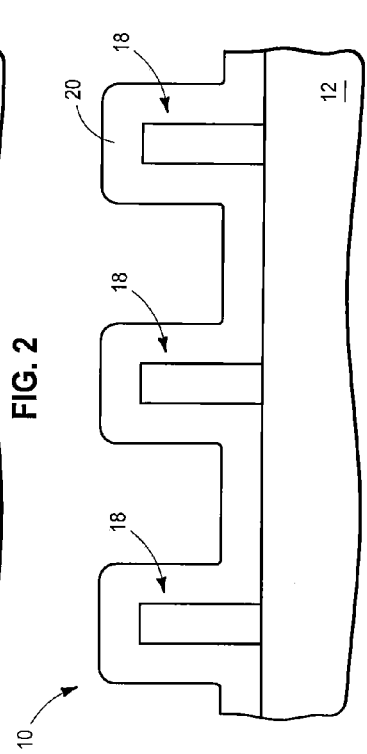

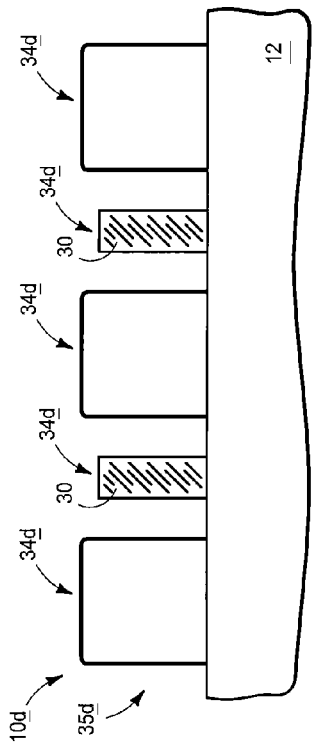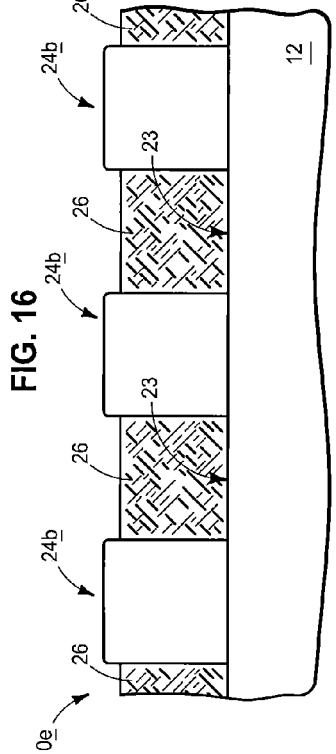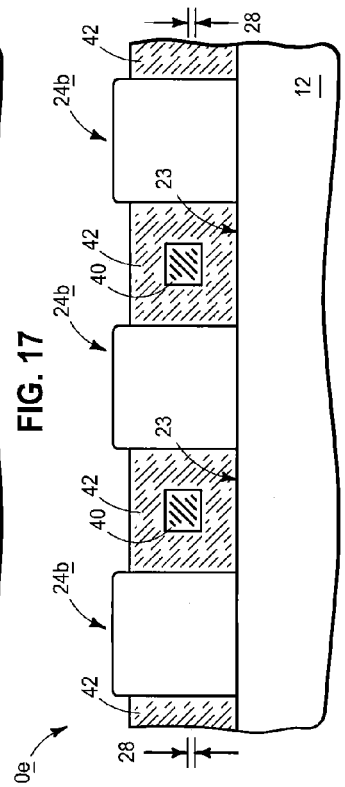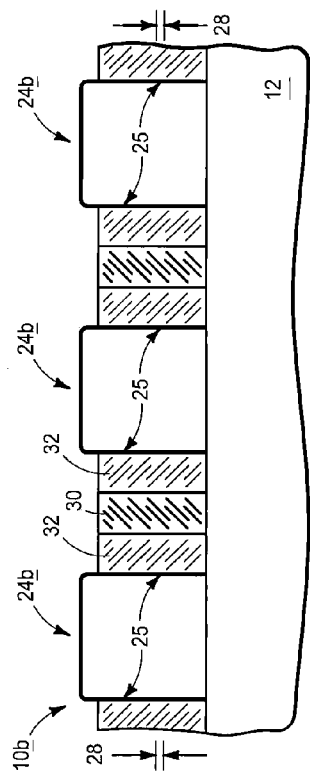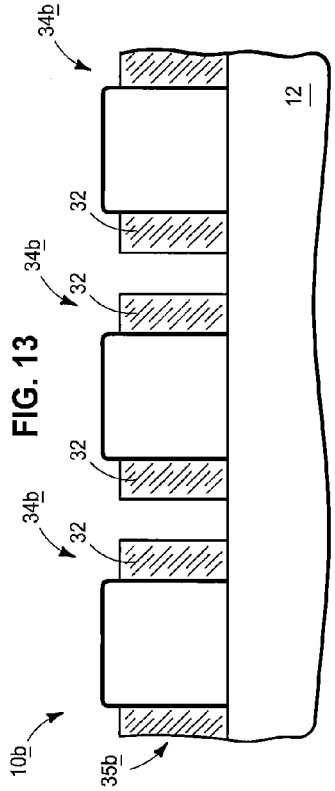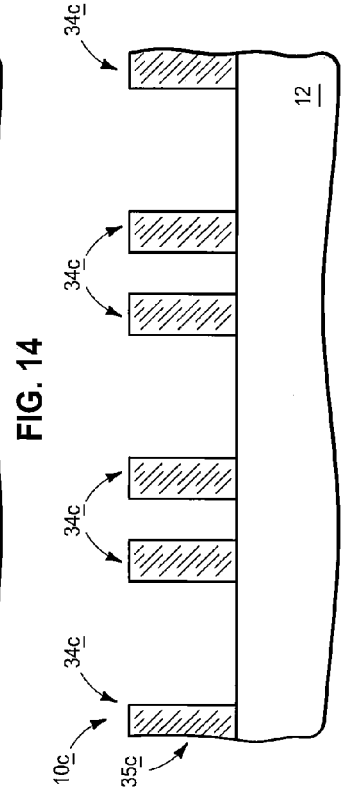

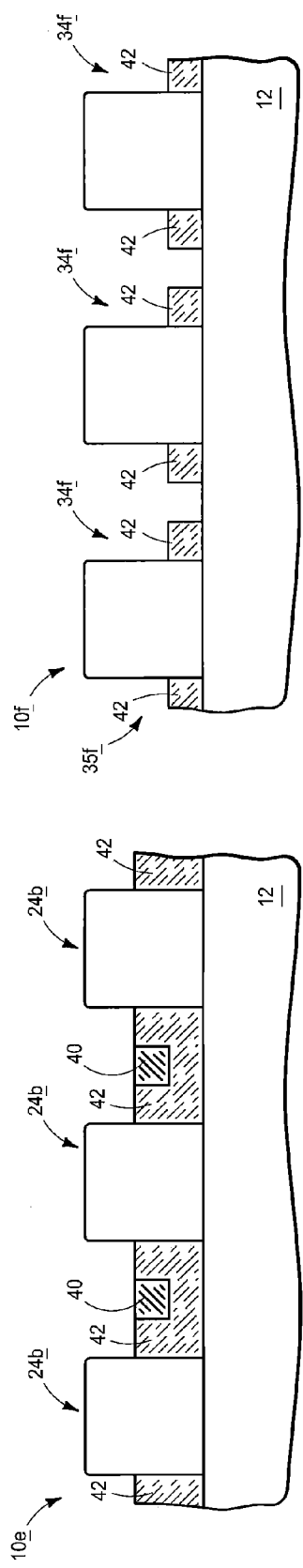
FIG. 19
FIG. 20
FIG. 21
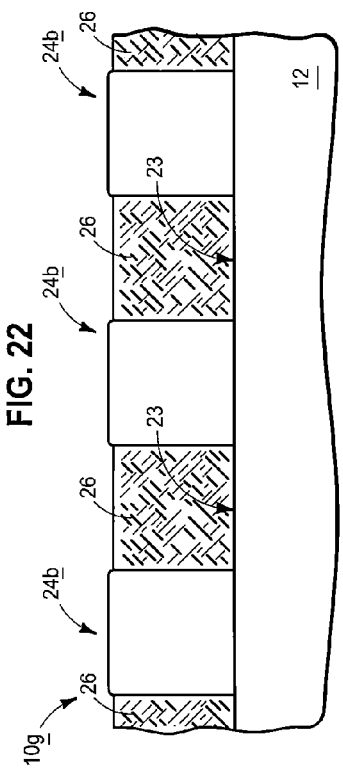
FIG. 22
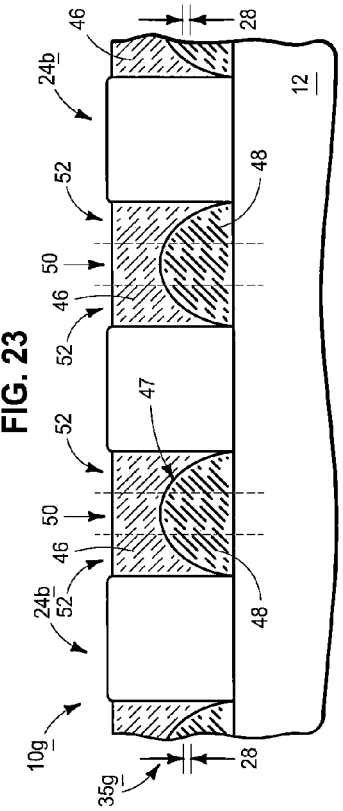
FIG. 23
FIG. 24

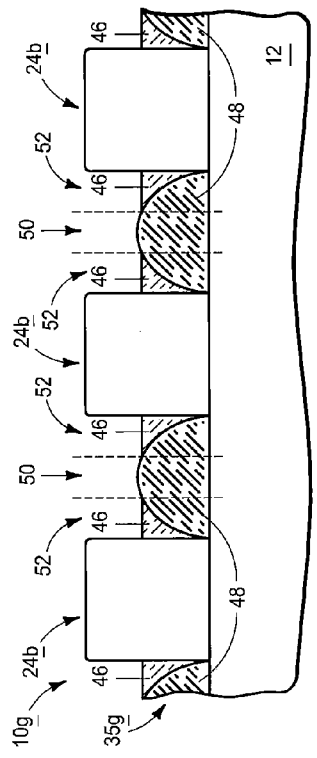
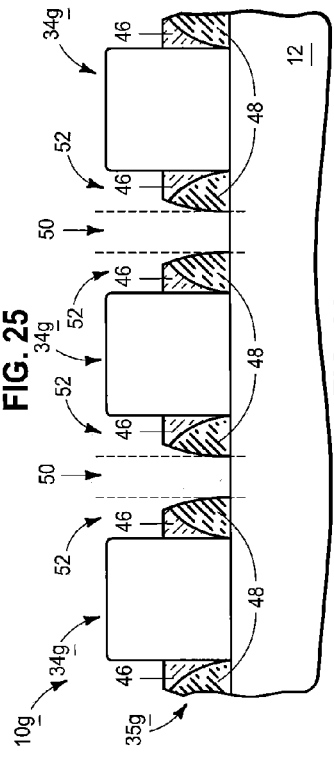
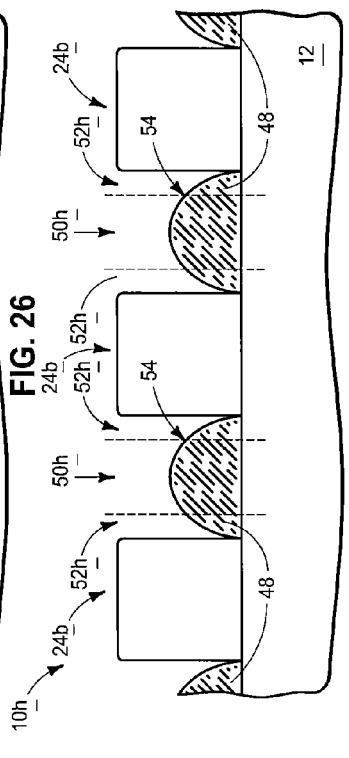
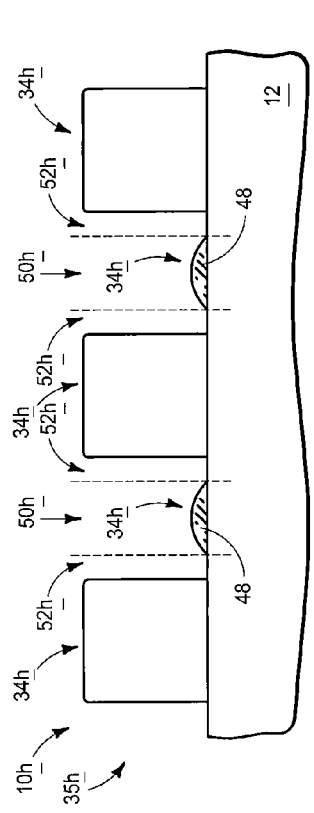
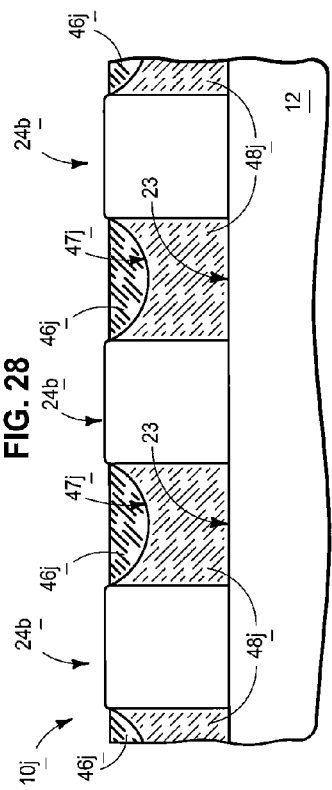
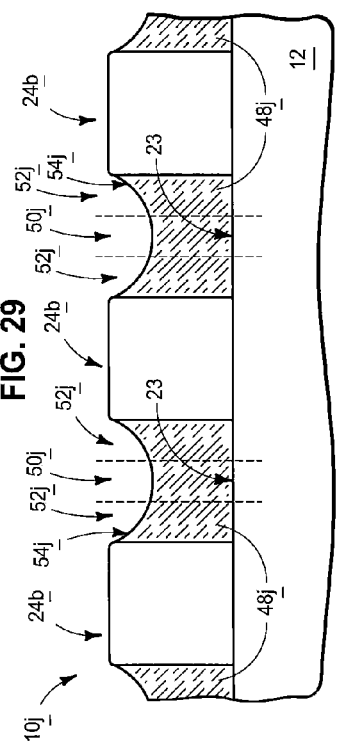

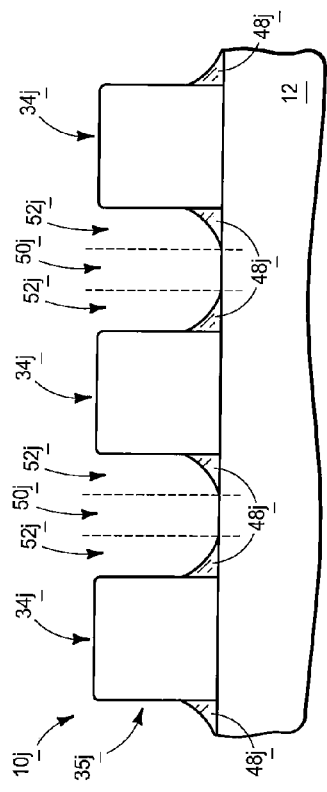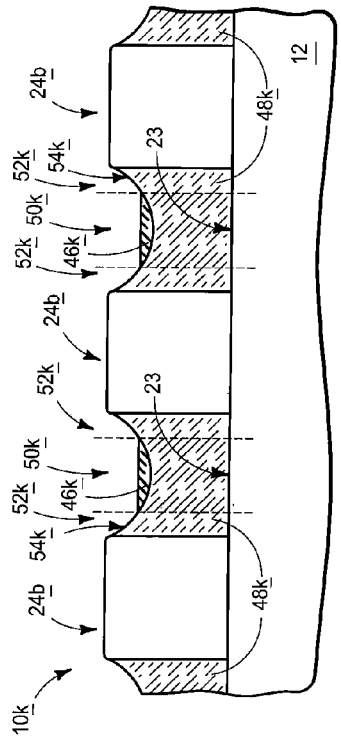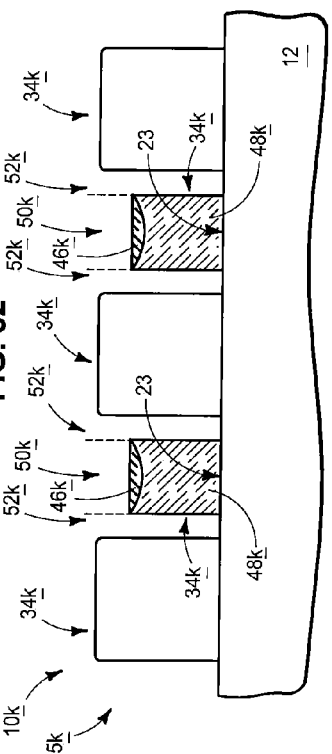

METHODS OF PATTERNING SUBSTRATES

TECHNICAL FIELD

Embodiments disclosed herein pertain to methods of patterning substrates.

BACKGROUND

Integrated circuits are often formed on a semiconductor substrate such as a silicon wafer or other semiconductive material. In general, various materials which are semiconductive, conductive, or electrically insulative are used to form the integrated circuits. By way of examples, the various materials may be doped, ion implanted, deposited, etched, grown, etc. using various processes. A continuing goal in semiconductive processing is to reduce the size of individual electronic components, thereby enabling smaller and denser integrated circuitry.

One technique for patterning and processing semiconductor substrates is photolithography. Such includes deposition of a patternable masking layer commonly known as photoresist. These materials can be processed to modify their solubility in certain solvents, and are thereby readily usable to form patterns on a substrate. For example, portions of a photoresist layer can be exposed to actinic energy through openings in a radiation-patterning tool, such as a mask or reticle, to change the solvent solubility of the exposed regions versus the unexposed regions compared to the solubility in the as-deposited state. Thereafter, the exposed or unexposed regions can be removed, depending on the type of photoresist, to leave a masking pattern of the photoresist on the substrate. Adjacent areas of the underlying substrate next to the masked portions can be processed, for example by etching or ion implanting, to effect the desired processing of the substrate adjacent the masking material. In certain instances, multiple different layers of photoresist and/or a combination of photoresists with non-radiation sensitive masking materials are used. Further, patterns may be formed on substrates without using photoresist.

The continual reduction in feature sizes places ever greater demands on the techniques used to form the features. For example, photolithography is commonly used to form patterned features such as conductive lines and arrays of contact openings to underlying circuitry. A concept commonly referred to as "pitch" can be used to describe the sizes of repeating features in conjunction with spaces immediately adjacent thereto. Pitch may be defined as the distance between an identical point in two neighboring features of a repeating pattern in a straight line cross section, thereby including the maximum width of the feature and the space to the next immediately adjacent feature. However, due to factors such as optics and light or radiation wavelength, photolithography techniques tend to have a minimum pitch below which a particular photolithographic technique cannot reliably form features. Thus, minimum pitch of a photolithographic technique is an obstacle to continued feature size reduction using photolithography.

Pitch doubling or pitch multiplication is one proposed method for extending the capabilities of photolithographic techniques beyond their minimum pitch. Such typically forms features narrower than minimum photolithography resolution by depositing one or more spacer-forming layers to have a total lateral thickness which is less than that of the minimum capable photolithographic feature size. The spacer-forming layers are commonly anisotropically etched to form sub-lithographic features, and then the features which were formed at the minimum photolithographic feature size are etched from the substrate.

Using such technique where pitch is actually halved, the reduction in pitch is conventionally referred to as pitch frequency "doubling". More generally, "pitch frequency multiplication" encompasses increase in pitch of two or more times, and also of fractional values other than integers. Thus, multiplication of pitch frequency by a certain factor actually involves reducing the pitch by that factor.

BRIEF DESCRIPTION OF THE DRAWINGS

FIG. 1 is a diagrammatic, cross-sectional view of substrate fragment in process in accordance with an embodiment of the invention.

FIG. 2 is a view of the FIG. 1 substrate at a processing stage subsequent to that of FIG. 1.

FIG. 3 is a view of the FIG. 2 substrate at a processing stage subsequent to that of FIG. 2.

FIG. 4 is a view of the FIG. 3 substrate at a processing stage subsequent to that of FIG. 3.

FIG. 5 is a view of the FIG. 4 substrate at a processing stage subsequent to that of FIG. 4.

FIG. 6 is a view of the FIG. 5 substrate at a processing stage subsequent to that of FIG. 5.

FIG. 13 is a view of the FIG. 12 substrate at a processing stage subsequent to that of FIG. 12.

FIG. 14 is a view of the FIG. 13 substrate at a processing stage subsequent to that of FIG. 13.

FIG. 15 is a diagrammatic, cross-sectional view of substrate fragment in process in accordance with an embodiment of the invention.

FIG. 16 is a diagrammatic, cross-sectional view of substrate fragment in process in accordance with an embodiment of the invention.

FIG. 17 is a diagrammatic, cross-sectional view of substrate fragment in process in accordance with an embodiment of the invention.

FIG. 18 is a view of the FIG. 17 substrate at a processing stage subsequent to that of FIG. 17.

FIG. 19 is a view of the FIG. 18 substrate at a processing stage subsequent to that of FIG. 18.

FIG. 20 is a view of the FIG. 19 substrate at a processing stage subsequent to that of FIG. 19.

FIG. 21 is a diagrammatic, cross-sectional view of substrate fragment in process in accordance with an embodiment of the invention.

FIG. 22 is a view of the FIG. 21 substrate at a processing stage subsequent to that of FIG. 21.

FIG. 23 is a diagrammatic, cross-sectional view of substrate fragment in process in accordance with an embodiment of the invention.

FIG. 24 is a view of the FIG. 23 substrate at a processing stage subsequent to that of FIG. 23.

FIG. 25 is a view of the FIG. 24 substrate at a processing stage subsequent to that of FIG. 24.

FIG. 26 is a view of the FIG. 25 substrate at a processing stage subsequent to that of FIG. 25.

FIG. 27 is a diagrammatic, cross-sectional view of substrate fragment in process in accordance with an embodiment of the invention.

FIG. 28 is a view of the FIG. 27 substrate at a processing stage subsequent to that of FIG. 27.

FIG. 29 is a diagrammatic, cross-sectional view of substrate fragment in process in accordance with an embodiment of the invention.

FIG. 30 is a view of the FIG. 29 substrate at a processing stage subsequent to that of FIG. 29.

FIG. 31 is a view of the FIG. 30 substrate at a processing stage subsequent to that of FIG. 30.

FIG. 32 is a diagrammatic, cross-sectional view of substrate fragment in process in accordance with an embodiment of the invention.

FIG. 33 is a view of the FIG. 32 substrate at a processing stage subsequent to that of FIG. 32.

DETAILED DESCRIPTION OF EXAMPLE EMBODIMENTS

Figure 7:
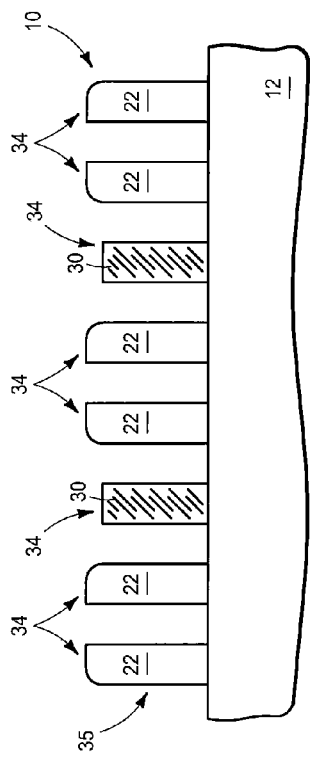
FIG. 7 is a view of the FIG. 6 substrate at a processing stage subsequent to that of FIG. 6.

Initial example methods of forming a pattern on a substrate are described with reference to FIGS. 1-7 with respect to a substrate fragment 10. In the example processing shown by FIGS. 1-7, pitch frequency tripling will occur although processing may be used which achieves other pitch frequency multiplication, including non-integer pitch frequency multiplication.

Referring to FIG. 1, substrate 10 comprises a base substrate or material 12 having patterned masking material 14 formed there-over. Substrate 12 may be homogenous or non-homogenous, for example comprising multiple different composition materials and/or layers. As an example, substrate 12 may comprise bulk-monocrystalline silicon and/or a semiconductor-on-insulator substrate. As an additional example, such may comprise dielectric material having conductive contacts or vias therein which extend vertically or otherwise into conductive electrical connection with electronic device components, regions, or material received elevationally inward of the dielectric material. Substrate 12 may be a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Masking material 14 may be homogenous or non-homogenous, and may comprise multiple different composition materials and/or layers. One example material is photoresist. Additional materials such as hard-masking materials and anti-reflective coatings may constitute a part of masking material 14 and/or substrate 12. FIG. 1 shows masking material 14 as having been patterned to form spaced features 16 over substrate 12. Features 16 may be fabricated by any existing or yet-to-be developed technique. Examples include lithography, for example photolithography. Where photolithography is used, spaced features 16 may be patterned to be at, greater than, or less than the minimum photolithographic resolution with which substrate 10 is fabricated. Spaced features 16 are shown as being equal in size and shape relative one another and equally spaced relative to each immediately adjacent feature, although alternate configurations may be used. As an example, features 16 may be longitudinally elongated into and out of the plane of the page upon which FIG. 1 lies, thereby forming elongated lines having longitudinally elongated trenches inherently defined between masking material 14. Alternately as another example, masking material 14 may have been patterned such that the depicted spaces there-between constitute contact openings of a contact opening pattern.

Referring to FIG. 2, spaced features 16 of FIG. 1 have been processed to laterally trim their respective widths, thereby forming spaced features 18. The trimming may be conducted by an isotropic etch which removes material approximately equally (not shown) from the sides and tops of features 16 of FIG. 1. Alternately, chemistries and conditions may be used which tend to etch greater or all material from the sides of features 16 than from their respective tops, as is shown. Alternately, chemistries and conditions may be used which tend to etch greater material from the tops of features 16 than from the sides. Alternately, no lateral or top trimming may be conducted. As a specific example, the construction shown in FIG. 2 where masking material 14 comprises photoresist may be derived by plasma etching the substrate of FIG. 1 within an inductively coupled reactor. Example etching parameters include pressure from about 2 mTorr to about 20 mTorr, source power from about 150 watts to about 500 watts, bias voltage at less than or equal to about 25 volts, substrate temperature of from about 0° C. to about 100° C., $Cl_2$ and/or HBr flow from about 20 sccm to about 100 sccm, $O_2$ flow from about 5 sccm to about 20 sccm, and $CF_4$ flow from about 80 sccm to about 120 sccm. In but one example only, the description proceeds relative to fabrication of a feature pattern on a substrate having a uniform final feature width of about the minimum lateral width of features 18. Other minimum lateral widths may be used, including non-uniform lateral widths and/or non-uniform spacings between features.

Referring to FIG. 3, a spacer-forming layer 20 has been formed over features 18. Layer 20 may be homogenous or non-homogenous, may be sacrificial, and may be formed by any suitable deposition technique. Example compositions include silicon dioxide and silicon nitride. In the depicted example, spacer-forming layer 20 has been deposited to a thickness that is about equal to the lateral width of features 18.

Referring to FIG. 4, spacer-forming layer 20 has been subjected to an anisotropic etch to form example spaced first features 24 over substrate 12. In the depicted example, individual spaced first features 24 may be considered as comprising sidewall portions 22 which are of different composition than material 14 that is laterally between sidewall portions 22. Alternate processing may be used to form spaced first features 24, and sidewall portions 22 need not be of the same composition. As an additional example embodiment, a material deposited over spaced features 18 may react with outermost portions of features 18 to form an inorganic silicon polymer or other material as is described, for example, in U.S. Patent Application Publication No. 2009/0291397 to Anton deVilliers which published on Nov. 26, 2009.

Referring to FIG. 5, a mixture 26 of immiscible materials has been provided between spaced first features 24. Mixture 26 may comprise two or more than two immiscible materials. Mixture 26 may be amorphous or non-amorphous. Example immiscible material combinations include a polymer and a non-polymer; two immiscible non-polymers; two immiscible polymers; two immiscible molecular glasses; a polymer or non-polymer and a molecular glass; etc. Example polymers include polystyrene, polymethacrylate, polyethylene, polypropylene, polybutadiene, polyvinylpyridine, polyvinyl-chloride, etc. A specific example comprises directed self-assembly (DSA) materials available from JSR Micro of Sunnyvale, Calif., USA, which contain a blend of a silicon-containing polymer (e.g., at least 18% by weight) and an organic polymer. FIG. 5 diagrammatically illustrates mixture 26 as comprising one immiscible material shown with darker lines upwardly angling to the right, and another immiscible shown with lighter lines downwardly angling to the right. Mixture 26 may be provided between spaced first features 24 by any suitable manner, including being spun-on as a liquid which hardens, by vapor deposition, or by any other existing or yet-to-be-developed manner.

Referring to FIG. 6, mixture 26 of FIG. 5 has been processed to laterally separate at least two of the immiscible materials along at least one elevation 28 between adjacent spaced first features 24, for example to form a laterally intermediate region 30 comprising one of the immiscible materials which is received between two laterally outer regions 32 comprising another of the immiscible materials along elevation 28. In the context of this document, an "elevation" is at least some continuous vertical thickness of mixture 26, and "along" is in the lateral direction. The act of laterally separating may everywhere laterally separate the one immiscible material from the another immiscible material as is shown in FIG. 6 (i.e., there is no elevational overlapping of the two immiscible materials relative each other). Alternately, the processing may leave at least two different immiscible materials which also elevationally overlap one another as will be described, for example, in additional embodiments below. Regardless, FIG. 6 shows but one embodiment wherein the laterally separating forms laterally intermediate regions 30 and laterally outer regions 32 to each have exposed elevationally outermost surfaces 33. FIG. 6 also shows one example embodiment where the laterally outer regions 32 are directly against sidewall portions 22. In this document, a material or structure is "directly against" another when there is at least some physical touching contact of the stated materials or structures relative one another. In contrast, "over", "on", and "against" not proceeded by "directly", encompass "directly against" as well as constructions where intervening material(s) or structure(s) result(s) in no physical touching contact of the stated materials or structures relative one another.

Example techniques for imparting the lateral separation (e.g., directed self-assembly) include one or both of suitable thermal annealing and exposure to a solvent vapor. For example, a mixture of immiscible silicon polymer and immiscible organic polymer might be separated by annealing alone, such as by exposure to a temperature of at least 100° C. at ambient pressure for from about 5 seconds to about 120 seconds. A mixture of immiscible molecular glasses or an immiscible mixture of a molecular glass and a polymer might be separated by annealing alone at temperatures above room temperature and below 100° C., as well as at temperatures above 100° C. As an example using solvent vapor, a suitable solvent vapor might be introduced into material 26 of FIG. 5 from a vapor phase to lower the glass transition temperature of one immiscible material in the mixture relative to another immiscible material in the mixture to impart the lateral separation. Such might be conducted at any suitable pressure, including room ambient, and might be conducted at room ambient temperature or higher temperatures. If vapor is introduced at elevated temperature, separation might be accelerated or imparted by a rapid quench to a lower temperature (i.e., at a rate of at least 20° C. per second) after suitable exposure to the solvent vapor at a higher temperature. A specific example solvent vapor for lowering glass transition temperature of a polydimethylsiloxane and polystyrene material mixture is toluene.

In one embodiment, the one and another immiscible materials may have equal surface tensions with respect to an atmosphere in which each is received (i.e., at least initially) during the processing which produces the lateral separation. The one and another immiscible materials may have equal interfacial energies (e.g., wetting tendency) with respect to a base 23 (FIG. 4) between the adjacent spaced first features on which mixture 26 lies. The another immiscible material may have lower interfacial energy (e.g., greater wetting tendency) with respect to sidewalls of sidewall portions 22 than does the one immiscible material. These facets may facilitate producing entirely laterally separated regions having no elevational overlap where that is desired and as is shown in FIG. 6 in but one example.

Referring to FIG. 7, laterally outer regions 32 (not shown) and material 14 (not shown) between sidewall portions 22 have been removed to form a pattern 35 of spaced second features 34 over substrate 12. An example removing technique is chemical etching whereby materials 14 and 32 of FIG. 6 are etched selectively (i.e., at a removal rate of at least 2:1) relative to materials 22, 30 and 12. Such may occur substantially commensurately, for example using a single etching chemistry. Alternately as an example, the etching may occur in separate etching steps using different chemistries.

Pattern 35 formed over substrate 10 may or may not comprise a part of the finished construction of substrate 10. Further and regardless, pattern 35 may be subsequently modified, for example by laterally trimming or deposition of further material thereover, and including repeating processing with the same or another mixture of immiscible materials. Regardless, FIG. 7 shows an example embodiment wherein second features 34 of pattern 35 have equal maximum lateral widths and equal spacing there-between which are the same as those maximum lateral widths. Alternate widths, width profiles, and spacings may be used, including those which are not necessarily uniform or consistent.

Figure 8:
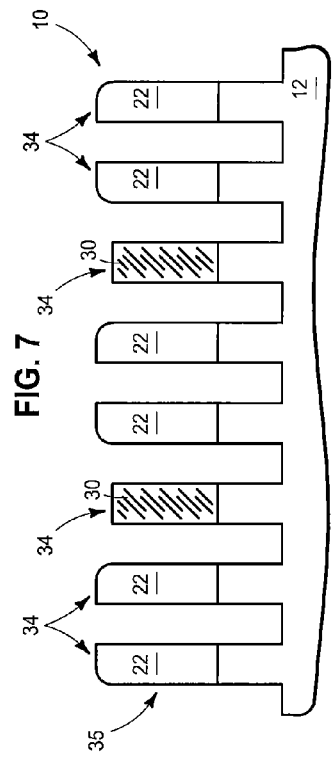
FIG. 8 is a view of the FIG. 7 substrate at a processing stage subsequent to that of FIG. 7.

Embodiments of the invention also comprise processing the substrate through a mask pattern which comprises spaced second features 34. FIG. 8 depicts one such example wherein substrate 10 has been processed by etching through a mask pattern comprised of pattern 35 to etch into material 12. Any alternate existing or yet-to-be-developed processing might also or alternately be conducted, for example doping, ion implanting, selective deposition, etc.

Figure 9:
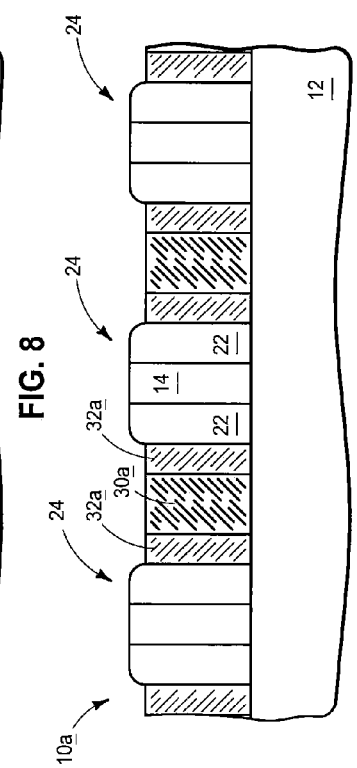
FIG. 9 is a diagrammatic, cross-sectional view of substrate fragment in process in accordance with an embodiment of the invention.

Example mixture 26 as shown in FIG. 5 may comprise equal or unequal volumes of the one and another immiscible materials therein. FIG. 6 essentially shows an example wherein the volume of the another immiscible material represented by the lighter lines downwardly angling to the right is twice that of the one immiscible material represented by the darker lines upwardly angling to the right (i.e., a 2:1 volume ratio), whereby lateral portions 30 and 32 are of the same respective volumes and lateral widths. FIG. 9 shows an alternate example embodiment substrate 10a. Like numerals from the first-described embodiment have been used where appropriate, with some construction differences being indicated with the suffix "a". With respect to an embodiment to produce the FIG. 9 construction, a mixture (not shown) of immiscible materials of FIG. 5 may be initially provided which comprises equal volumes of the one and another immiscible materials. Therefore in FIG. 9, the separated volume of laterally intermediate region 30a is equivalent to the sum of the volumes of the separated two laterally outer regions 32a. Processing may occur subsequently as described with respect to FIGS. 7 and 8. Processing alternate and/or additionally to that of FIGS. 7 and/or 8 might be conducted with respect to FIG. 9 and as well as with all other embodiments described below.

Figure 10:
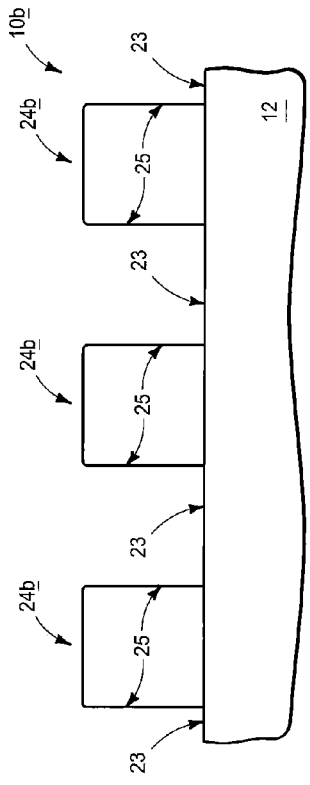
FIG. 10 is a diagrammatic, cross-sectional view of substrate fragment in process in accordance with an embodiment of the invention.

Additional methods of patterning a substrate in accordance with embodiments of the invention are next described initially with reference to FIGS. 10-13 with respect to a substrate 10b. Like numerals from the above-described embodiments have been used where appropriate, with some construction differences being indicated with the suffix "b" or with different numerals. FIG. 10 shows substrate 10b as comprising spaced first features 24b not necessarily comprising sidewall portions of different composition than material that is laterally between the sidewall portions as was described with respect to the embodiments of FIGS. 1-9. However, spaced first features 24b may be the same as that described above with respect to FIG. 4. Regardless, spaced first features 24b may be considered as comprising sidewalls 25.

Figure 11:
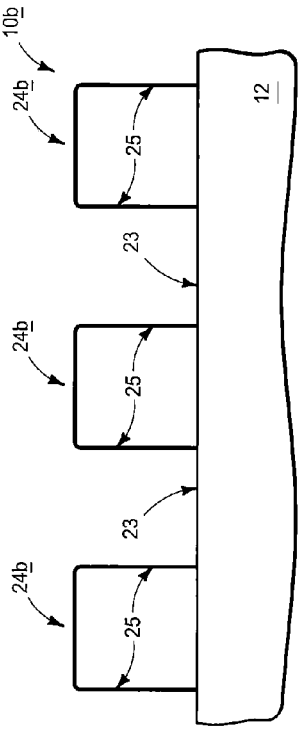
FIG. 11 is a view of the FIG. 10 substrate at a processing stage subsequent to that of FIG. 10.

Referring to FIG. 11, sidewalls 25 of spaced first features 24b have been treated to change interfacial energy (e.g., wetting tendency) of one immiscible material relative to such sidewalls in comparison to interfacial energy (e.g., wetting tendency) of another immiscible material relative to such sidewalls. The treating is depicted in FIG. 11 by thickening of the FIG. 10 perimeter line defining first features 24b. The treating may deposit a material onto sidewalls 25, or the treating may not deposit material onto the sidewalls. Regardless, in one embodiment, the treating may increase the interfacial energy of the one or another immiscible material relative to sidewalls 25. In one embodiment, the treating may decrease the interfacial energy of the one or another immiscible material relative to sidewalls 25. The treating may comprise exposing the sidewalls to liquid and/or vapor. With respect to the embodiments of FIGS. 1-9, the treating may occur of the FIG. 4 substrate prior to providing the mixture 26 of immiscible materials of FIG. 5. The treating may impact (not shown) interfacial energy of the one and/or another immiscible material relative to bases 23 between immediately adjacent spaced first features 24b. One example treating includes exposing sidewalls 25 to a hexamethyldisilazane fluid (e.g., vapor and/or liquid) at from about 120° C. to about 180° C. at ambient pressure for from about 30 seconds to about 60 seconds. As an example, such may have the effect of lowering interfacial energy of a polydimethylsiloxane polymer with respect to untreated silicon oxynitride sidewalls. As alternate examples, a self-assembling monolayer material (e.g., an alkyl trichlorosilane) or a polymer brush material (e.g., hydroxylated polystyrene) may be applied as a layer over the sidewalls.

Figure 12:
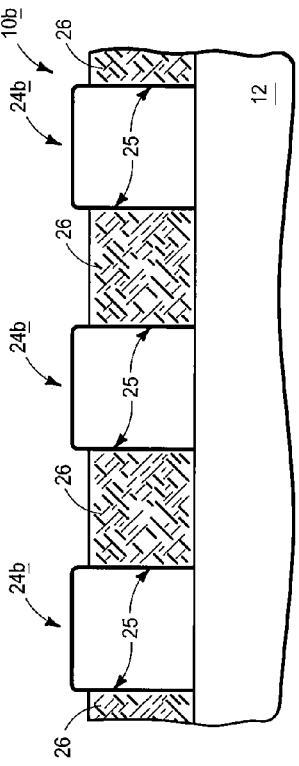
FIG. 12 is a view of the FIG. 11 substrate at a processing stage subsequent to that of FIG. 11.

Referring to FIG. 12, a mixture 26 comprising the one and another immiscible materials has been provided between the spaced first features 24b having the treated sidewalls 25. In FIG. 13, that mixture has been treated to laterally separate the one and another immiscible materials along at least one elevation 28 between adjacent spaced first features 24b. The act of laterally separating has formed along elevation 28 a laterally intermediate region 30 between two laterally outer regions 32, wherein region 30 comprises the one or another immiscible material having greater interfacial energy relative to treated sidewalls 25 than does the other of the one and another immiscible materials of regions 32 which has lower interfacial energy relative to treated sidewalls 25. In one embodiment, the act of laterally separating forms laterally outer regions 32 to respectively be directly against a respective one of treated sidewalls 25. Volumes of the one and another immiscible materials may be chosen to produce different constructions when lateral separation occurs, for example the construction of FIG. 9 with respect to regions 30a and 32a, or other constructions.

One of a) laterally intermediate regions 30, or b) laterally outer regions 32, are removed to form spaced second features over the substrate. FIG. 14 shows an example embodiment wherein laterally intermediate regions 30 (not shown) have been removed to form spaced second features 34b and a resultant pattern 35b over substrate 12. An example removal technique includes chemically etching material of intermediate region 30 selectively relative to laterally outer regions 32 and material of spaced first features 24b.

FIG. 15 shows additional or alternate processing from that of FIG. 14 with respect to a substrate 10c. Like numerals from the above-described embodiments have been used where appropriate, with some construction differences being indicated with the suffix "c". FIG. 15 shows an embodiment wherein the act of removing is also of laterally intermediate regions 30 (not shown). Additionally, at least a portion of spaced first features 24b (not shown) has been removed in forming spaced second features 34c over substrate 12 to form a pattern 35c. In one embodiment and as shown, all of spaced first features 24b (not shown) have been removed. Removal of at least some of spaced first features 24b when conducted may occur commensurate with the removing of laterally intermediate regions 30 (not shown) or separately.

FIG. 16 shows an alternate example processing embodiment with respect to a substrate 10d. Like numerals from the above-described embodiments have been used where appropriate, with some construction differences being indicated with the suffix "d". In FIG. 16, the act of removing is of laterally outer regions 32 (not shown) as opposed to intermediate regions 30 and the first features, thereby producing a pattern 35d of spaced second features 34d.

Example additional embodiments of methods of patterning a substrate are next described with respect to a substrate 10e as shown in FIGS. 17-20. Like numerals from the above-described embodiments have been used where appropriate, with some construction differences being indicated with the suffix "e" or with different numerals. Referring to FIG. 17, spaced first features 24b have been formed over substrate 12. The spaced first features may alternately be of a construction as described with respect to FIG. 4, or of other constructions. The sidewalls of spaced first features 24b may be treated (not shown) in accordance with the description pertaining to the FIG. 11 embodiments. Regardless, a mixture 26 of immiscible materials has been provided between spaced first features 24b. The immiscible materials of mixture 26 in FIG. 17 may be different from those in the above-described embodiments. Alternately and/or additionally, composition of a) bases 23, and/or b) sidewalls of spaced first features 24b may be different from those in the above-described embodiments.

Referring to FIG. 18, mixture 26 of FIG. 17 has been processed to laterally separate at least two of the immiscible materials along at least one elevation 28 between adjacent spaced first features 24b. The act of laterally separating has formed a laterally intermediate region 40 comprising one of the immiscible materials that is surrounded laterally and elevationally by another region 42 comprising another of the immiscible materials. Such processing may occur using techniques as described above. In one embodiment, the another immiscible material of region 42 has lower surface tension than the one immiscible material of region 40 with respect to an atmosphere in which each is received (i.e., at least initially) during the act of laterally separating. The another immiscible material of region 42 may have lower interfacial energy (e.g., greater wetting tendency) with respect to a base 23 between adjacent spaced first features 24b than does the one immiscible material of intermediate region 40. The another immiscible material of surrounding region 42 may have lower interfacial energy (e.g., greater wetting tendency) with respect to sidewalls of first features 24b than does the one immiscible material of intermediate region 40.

One of a) the laterally intermediate regions, or b) the another material that is laterally outward of the laterally intermediate regions, are removed to form spaced second features over the substrate. FIGS. 19 and 20 show an embodiment wherein the act of removing is of the another material of regions 42 that are laterally outward of laterally intermediate regions 40. Regardless, the act of removing may occur by etching and/or other methods. As an example, FIG. 19 shows initial removal of material of surrounding regions 42 inwardly at least to a point of exposing intermediate regions 40. FIG. 20 shows subsequent or continued removing of material of regions 42 that is laterally outward of intermediate regions 40 elevationally inward to bases 23, thereby forming a pattern 35e of spaced second features 34e over substrate 12. An anisotropic etch of material 42 conducted selectively relative to material 40 may be used to produce the processing from FIG. 18 to FIG. 20.

FIGS. 21 and 22 show an alternate example embodiment wherein the act of removing is of the laterally intermediate regions. Like numerals from the above-described embodiments have been used where appropriate, with some construction differences being indicated with the suffix "f". FIG. 21 shows a substrate 10f which has been processed differently in comparison to that of FIG. 20. Specifically, intermediate regions 40 (not shown) that were shown in FIG. 19 have been removed selectively relative to material of remaining surrounding region 42. In FIG. 22, the remaining material of surrounding region 42 has been anisotropically etched inwardly to form a pattern 35f comprising spaced second features 34f over substrate 12.

Additional example embodiments of methods of patterning a substrate in accordance with the invention are next described with respect to a substrate 10g in connection with FIGS. 23-26. Like numerals from the above-described embodiments have been used where appropriate, with some construction differences being indicated with the suffix "g" or with different numerals. Referring to FIG. 23, spaced first features 24b have been formed over substrate 12. The spaced first features may alternately be of a construction as described with respect to FIG. 4, or of other constructions. The sidewalls of spaced first features 24b may be treated (not shown) in accordance with the description pertaining to the FIG. 11 embodiments. Regardless, a mixture 26 of immiscible materials has been provided between spaced first features 24b. The immiscible materials of mixture 26 in FIG. 23 may be different from those in the above-described embodiments. Alternately and/or additionally, composition of a) bases 23, and/or b) sidewalls of spaced first features 24b may be different from those in the above-described embodiments.

Referring to FIG. 24, substrate 10g has been processed to laterally separate at least two of the immiscible materials along at least one elevation 28 between adjacent spaced first features 24b. Such has formed an elevationally outermost region 46 comprising one of the immiscible materials which covers an elevationally innermost region 48 comprising another of the immiscible materials. Elevationally outermost region 46 and elevationally innermost region 48 have a curved (i.e., non-straight) interface 47 there-between. Curved interface 47 might be continuously curved and/or have differently curved portions, including one or more intervening straight portions. FIG. 24 shows an example embodiment where interface 47 is curved elevationally outward (e.g., is substantially convex). In one embodiment, the another immiscible material of innermost region 48 has greater surface tension than the one immiscible material of outermost region 46 with respect to an atmosphere in which each is received (i.e., at least initially) during the act of laterally separating. The another immiscible material of innermost region 48 may have lower interfacial energy (e.g., greater wetting tendency) with respect to a base 23 (FIG. 23) between adjacent spaced first features 24b than does the one immiscible material of elevationally outermost region 46. The one immiscible material of outermost region 46 may have lower interfacial energy (e.g., greater wetting tendency) with respect to sidewalls of first features 24b than does the another immiscible material of innermost region 48.

Substrate 10g of FIG. 24 between features 24b may be considered as comprising a laterally intermediate region 50 of the two immiscible materials of regions 46 and 48, and laterally outer regions 52 of the two immiscible materials of regions 46 and 48 that are laterally outward of laterally intermediate region 50. One of a) laterally intermediate regions 50 of the two immiscible materials, or b) laterally outer regions 52 of the two immiscible materials between adjacent spaced first features 24b, are removed to form spaced second features over substrate 12. Example processing wherein the act of removing is of laterally intermediate regions 50 is described with reference to FIGS. 25 and 26. Referring to FIG. 25, elevationally outermost region 46 has been removed inwardly to expose elevationally innermost region 48, forming lateral outer regions 52 to still comprise the one immiscible material of region 46 elevationally over the another immiscible material of innermost region 48. Remaining of the laterally intermediate regions 50 may predominantly comprise the another immiscible material of elevationally innermost region 48.

Referring to FIG. 26, the another immiscible material of the remaining of laterally intermediate regions 50 has been anisotropically etched substantially selectively relative to the remaining one immiscible material of elevationally outermost regions 46, thereby forming a spaced pattern 35g of spaced second features 34g over substrate 12. Additionally, some or all of remaining portions of first features 24b of FIG. 25 could be removed (not shown).

FIGS. 27 and 28 show an alternate embodiment substrate 10h in a method of patterning a substrate analogous to that described above with respect to FIGS. 25 and 26 but wherein the act of removing is of the laterally outer regions. Like numerals from the above-described embodiments have been used where appropriate, with some construction differences being indicated with the suffix "h" or with different numerals. Referring to FIG. 27, all of elevationally outermost regions 46 (not shown) has been removed inwardly to expose elevationally outward curving outer surfaces 54 of elevationally innermost regions 48. Surfaces 54 may be the same as interfaces 47. Alternately, removal of some of innermost regions 48 may occur wherein the previously defining interface lines 47 are removed and outer surfaces 54 are elevationally inward thereof.

Referring to FIG. 28, the another immiscible material of elevationally innermost regions 48 has been removed elevationally inward to substrate 12 to remove remaining of laterally outer regions 52h and leave a remnant of material 48 to form laterally intermediate region 50h. Thereby, a pattern 35h comprising spaced second features 34h over substrate 12 has been formed. Additionally, remaining portions of first features 24b of FIG. 27 could be removed (not shown).

Additional methods of patterning a substrate are next described with reference to FIGS. 29-31 with respect to a substrate 10j. Like numerals from the above-described embodiments have been used where appropriate, with some construction differences being indicated with the suffix "j" or with different numerals. FIG. 29 shows substrate 10j analogous to the substrate of FIG. 24, but wherein interface 47j is curved elevationally inward (e.g., is substantially concave). The immiscible materials of a mixture which is used to produce the construction of FIG. 29 may be different from those in the above-described embodiments. Alternately and/or additionally, composition of a) bases 23, and/or b) sidewalls of spaced first features 24b may be different from those in the above-described embodiments. In one embodiment, the another immiscible material of innermost region 48j has greater surface tension than the one immiscible material of outermost region 46j with respect to an atmosphere in which each is received (i.e., at least initially) during the act of laterally separating. The another immiscible material of innermost region 48j may have lower interfacial energy (e.g., greater wetting tendency) with respect to bases 23 between adjacent spaced first features 24b than does the one immiscible material. The another immiscible material may have lower interfacial energy (e.g., great wetting tendency) with respect to sidewalls of spaced first features 24b than does the one immiscible material of outermost region 46j.

Referring to FIG. 30, all of elevationally outermost regions 46j (not shown) has been removed inwardly to expose an elevationally inward curving outer surface 54j of elevationally innermost regions 48j. Surface 54j may be the same as interface 47j. Alternately, removal of some of innermost regions 48j may occur wherein the previously defining interface lines 47j are removed and outer surfaces 54j are elevationally inward thereof.

Referring to FIG. 31, the another immiscible material of elevationally innermost regions 48j has been removed elevationally inward to substrate 12 to remove remaining of laterally intermediate regions 50j and leave a remnant of material 48j to form laterally outer regions 52j. Thereby, a pattern 35j comprising spaced second features 34j over substrate 12 has been formed. Additionally, remaining portions of first features 24b of FIG. 30 could be removed (not shown).

Additional methods of patterning a substrate are next described with reference to FIGS. 32 and 33 with respect to a substrate 10k. Like numerals from the above-described embodiments have been used where appropriate, with some construction differences being indicated with the suffix "k" or with different numerals. FIG. 32 shows substrate 10k analogous to the substrate of FIG. 30, but wherein the one admissible material 46k of outermost regions 52k remains elevationally over the another admissible material 48k to form laterally intermediate region 50k and laterally outer regions 52k. Laterally outer regions 52k and laterally intermediate region 50j may be of the same lateral dimensions relative one another or of different lateral dimensions relative one another and/or that of the FIG. 30 embodiment, with different lateral dimensions being shown in FIG. 32.

Referring to FIG. 33, the another admissible material 48k that was within the remaining of laterally outer regions 52k has been anisotropically etched selectively relative to the one admissible material atop laterally intermediate region 50k to form a pattern 35k comprising spaced second features 34k over substrate 12.

CONCLUSION

In some embodiments, a method of patterning a substrate comprises forming spaced first features over a substrate. Individual of the spaced first features comprise sidewall portions of different composition than material that is laterally between the sidewall portions. A mixture of immiscible materials is provided between the spaced first features. At least two of the immiscible materials are separated along at least one elevation between adjacent spaced first features. The act of laterally separating forms a laterally intermediate region comprising one of the immiscible materials between two laterally outer regions comprising another of the immiscible materials along the one elevation. The laterally outer regions are removed and material of the spaced first features is removed between the sidewall portions to form spaced second features over the substrate.

In some embodiments, a method of patterning a substrate comprises forming spaced first features over a substrate. Sidewalls of the spaced first features are treated to change interfacial energy of one immiscible material relative to the sidewalls in comparison to interfacial energy of another immiscible material relative to the sidewalls. A mixture comprising the one and another immiscible materials is provided between the spaced first features having the treated sidewalls. The one and another immiscible materials are laterally separated along at least one elevation between adjacent spaced first features. The act of laterally separating forms along the one elevation a laterally intermediate region comprising the one or another immiscible material having greater interfacial energy relative to the treated sidewalls between two laterally outer regions comprising the other of the one and other immiscible materials having lower interfacial energy relative to the treated sidewalls. One of a) the laterally intermediate regions, or b) the laterally outer regions, are removed to form spaced second features over the substrate.

In some embodiments, a method of patterning a substrate comprises forming spaced first features over a substrate. A mixture of immiscible materials is provided between the spaced first features. At least two of the immiscible materials are laterally separated along at least one elevation between adjacent spaced first features. The act of laterally separating forms a laterally intermediate region comprising one of the immiscible materials that is surrounded laterally and elevationally by a region comprising another of the immiscible materials. One of a) the laterally intermediate regions, or b) the another material that is laterally outward of the laterally intermediate regions, are removed to form spaced second features over the substrate.

In some embodiments, a method of patterning a substrate comprises forming spaced first features over a substrate. A mixture of immiscible materials is provided between the spaced first features. At least two of the immiscible materials are laterally separated along at least one elevation between adjacent spaced first features. The act of laterally separating forms an elevationally outermost region comprising one of the immiscible materials which covers an elevationally innermost region comprising another of the immiscible materials. The elevationally outermost and innermost regions have a curved interface there-between. After the act of laterally separating, one of a) a laterally intermediate region of the two immiscible materials, or b) laterally outer regions of the two immiscible materials that are laterally outward of the laterally intermediate region, are removed from between adjacent spaced first features to form spaced second features over the substrate.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of patterning a substrate, comprising:
forming spaced first features over a substrate, individual of the spaced first features comprising sidewall portions of different composition than material that is laterally between the sidewall portions;
providing a mixture of immiscible materials between the spaced first features;
laterally separating at least two of the immiscible materials along at least one elevation between adjacent spaced first features, the laterally separating forming a laterally intermediate region comprising one of the immiscible materials between two laterally outer regions comprising another of the immiscible materials along the one elevation; and
removing the laterally outer regions and removing the material of the spaced first features between the sidewall portions to form spaced second features over the substrate, the spaced second features comprising a combination of the different composition material of the sidewall portions and the one immiscible material of the laterally intermediate regions.

2. The method of claim 1 comprising treating sidewalls of the sidewall portions to change interfacial energy of the one or the another of the immiscible materials relative to the sidewalls in comparison to the other of the one and another immiscible materials.

3. The method of claim 1 wherein the mixture comprises unequal volumes of the one and another immiscible materials.

4. The method of claim 1 comprising forming the sidewall portions by anisotropically etching a layer deposited over the material received between the sidewall portions to form the sidewall portions to comprise sidewall spacers.

5. The method of claim 1 wherein the laterally separating forms the laterally intermediate and outer regions to each have exposed elevationally outermost surfaces.

6. The method of claim 5 wherein the one and another immiscible materials have equal surface tensions with respect to an atmosphere in which each is received during the laterally separating, the one and another immiscible materials have equal interfacial energies with respect to a base between the adjacent spaced first features, and the another immiscible material has lower interfacial energy with respect to sidewalls of the sidewall portions than does the one immiscible material.

7. A method of patterning a substrate, comprising:
forming spaced first features over a substrate, individual of the spaced first features comprising sidewall portions of different composition than material that is laterally between the sidewall portions;
providing a mixture of immiscible materials between the spaced first features;
laterally separating at least two of the immiscible materials along at least one elevation between adjacent spaced first features, the laterally separating forming a laterally intermediate region comprising one of the immiscible materials between two laterally outer regions comprising another of the immiscible materials along the one elevation;
removing the laterally outer regions and removing the material of the spaced first features between the sidewall portions to form spaced second features over the substrate; and
the laterally separating forming the laterally intermediate region to be surrounded laterally on both sides and elevationally top and bottom by the another of the immiscible materials.

8. A method of patterning a substrate, comprising:
forming spaced first features over a substrate, individual of the spaced first features comprising sidewall portions of different composition than material that is laterally between the sidewall portions;
providing a mixture of immiscible materials between the spaced first features;
laterally separating at least two of the immiscible materials along at least one elevation between adjacent spaced first features, the laterally separating forming a laterally intermediate region comprising one of the immiscible materials between two laterally outer regions comprising another of the immiscible materials along the one elevation;
removing the laterally outer regions and removing the material of the spaced first features between the sidewall portions to form spaced second features over the substrate; and
the laterally separating-forming an elevationally outermost region comprising the one immiscible material which covers an elevationally innermost region comprising the another immiscible material, the elevationally outermost and innermost regions having a curved interface there-between that individually extends from one sidewall portion to another sidewall portion of immediately adjacent of the spaced first features.

9. The method of claim 8 wherein,
the interface is curved elevationally inward;
the elevationally outermost region comprises the one immiscible material and the elevationally innermost region comprises the another immiscible material; and
the removing is of the laterally intermediate region, the removing comprising:
removing all of the elevationally outermost region inwardly to expose an elevationally inward curving outer surface of the elevationally innermost region; and
after removing all of the elevationally outermost region, removing the another immiscible material of the elevationally innermost region elevationally inward to the substrate to form remnant of the laterally outer regions to be spaced from one another.

10. The method of claim 8 wherein,
the interface is curved elevationally inward;
the elevationally outermost region comprises the one immiscible material and the elevationally innermost region comprises the another immiscible material; and
the removing is of the laterally outer regions, the removing comprising:
removing the elevationally outermost region inwardly to expose the elevationally innermost region and forming the laterally intermediate region to comprise the one immiscible material elevationally over the another immiscible material; and
after exposing the elevationally innermost region, anisotropically etching the another immiscible material of the remaining of the laterally outer regions selectively relative to the one immiscible material.

11. A method of patterning a substrate, comprising:
forming spaced first features over a substrate, individual of the spaced first features comprising sidewall portions of different composition than material that is laterally between the sidewall portions;

providing a mixture of immiscible materials between the spaced first features;

laterally separating at least two of the immiscible materials along at least one elevation between adjacent spaced first features, the laterally separating forming a laterally intermediate region comprising one of the immiscible materials between two laterally outer regions comprising another of the immiscible materials along the one elevation;

removing the laterally outer regions and removing the material of the spaced first features between the sidewall portions to form spaced second features over the substrate; and the laterally separating forming an elevationally outermost region comprising the one immiscible material which covers an elevationally innermost region comprising the another immiscible material, the elevationally outermost and innermost regions having a curved interface there-between, the interface being curved elevationally outward and the removing is of the laterally intermediate region, and comprising:

removing the elevationally outermost region inwardly to expose the elevationally innermost region and forming the lateral outer regions to comprise the one immiscible material elevationally over the another immiscible material; and after exposing the elevationally innermost region, anisotropically etching the another immiscible material of the remaining of the laterally intermediate region selectively relative to the one immiscible material.

12. A method of patterning a substrate, comprising:
forming spaced first features over a substrate, individual of the spaced first features comprising sidewall portions of different composition than material that is laterally between the sidewall portions;
providing a mixture comprising two immiscible materials between the spaced first features, the mixture comprising equal volumes of the two immiscible materials;
laterally separating the two immiscible materials along at least one elevation between adjacent spaced first features, the laterally separating forming a laterally intermediate region comprising one of the two immiscible materials between two laterally outer regions comprising the other of the two immiscible materials along the one elevation, sum of volumes of the two laterally outer regions equaling volume of the laterally intermediate region; and
removing the laterally outer regions and removing the material of the spaced first features between the sidewall portions to form spaced second features over the substrate.

13. A method of patterning a substrate, comprising:
forming spaced first features over a substrate;
providing a mixture of immiscible materials between the spaced first features;
laterally separating at least two of the immiscible materials along at least one elevation between adjacent spaced first features, the laterally separating forming an elevationally outermost region comprising one of the immiscible materials which covers an elevationally innermost region comprising another of the immiscible materials, the elevationally outermost and innermost regions having a curved interface there-between that individually extends from one sidewall to another sidewall of immediately adjacent of the spaced first features; and
after the laterally separating, removing from between adjacent spaced first features one of a) a laterally intermediate region of the two immiscible materials, or b) laterally outer regions of the two immiscible materials that are laterally outward of the laterally intermediate region, to form spaced second features over the substrate.

14. The method of claim 13 wherein the removing is of the laterally outer regions.

15. The method of claim 14 wherein the removing comprises:
removing all of the elevationally outermost region inwardly to expose an elevationally outward curving outer surface of the elevationally innermost region; and
after removing all of the elevationally outermost region, removing the another immiscible material of the elevationally innermost region elevationally inward to the substrate to remove remaining of the laterally outer regions and leave a remnant of the laterally intermediate region.

16. The method of claim 13 wherein the interface is curved elevationally outward.

17. The method of claim 16 wherein the another immiscible material has greater surface tension than the one immiscible material with respect to an atmosphere in which each is received during the laterally separating, the another immiscible material has lower interfacial energy with respect to a base between the adjacent spaced first features than does the one immiscible material, and the one immiscible materials has lower interfacial energy with respect to sidewalls of the first features than does the another immiscible material.

18. The method of claim 16 wherein the removing is of the laterally intermediate region.

19. The method of claim 13 wherein the interface is curved elevationally inward.

20. The method of claim 19 wherein the another immiscible material has greater surface tension than the one immiscible material with respect to an atmosphere in which each is received during the laterally separating, the another immiscible material has lower interfacial energy with respect to a base between the adjacent spaced first features than does the one immiscible material, and the another immiscible material has lower interfacial energy with respect to sidewalls of the first features portions than does the one immiscible material.

21. The method of claim 19 wherein,
the elevationally outermost region comprises the one immiscible material and the elevationally innermost region comprises the another immiscible material; and
the removing is of the laterally outer regions, the removing comprising:
removing the elevationally outermost region inwardly to expose the elevationally innermost region and forming the laterally intermediate region to comprise the one immiscible material elevationally over the another immiscible material; and
after exposing the elevationally innermost region, anisotropically etching the another immiscible material of the remaining of the laterally outer regions selectively relative to the one immiscible material.

22. A method of patterning a substrate, comprising:
forming spaced first features over a substrate;
providing a mixture of immiscible materials between the spaced first features;
laterally separating at least two of the immiscible materials along at least one elevation between adjacent spaced first features, the laterally separating forming an elevationally outermost region comprising one of the immiscible materials which covers an elevationally innermost region comprising another of the immiscible materials, the elevationally outermost and innermost regions having a curved interface there-between;
after the laterally separating, removing from between adjacent spaced first features one of a) a laterally intermediate region of the two immiscible materials, or b) laterally outer regions of the two immiscible materials that are laterally outward of the laterally intermediate region, to form spaced second features over the substrate;
the interface being curved elevationally outward;
the removing being of the laterally intermediate region; and comprising:
  removing the elevationally outermost region inwardly to expose the elevationally innermost region and forming the lateral outer regions to comprise the one immiscible material elevationally over the another immiscible material; and
  after exposing the elevationally innermost region, anisotropically etching the another immiscible material of remaining of the laterally intermediate region selectively relative to the one immiscible material.

23. A method of patterning a substrate, comprising:
forming spaced first features over a substrate;
providing a mixture of immiscible materials between the spaced first features;
laterally separating at least two of the immiscible materials along at least one elevation between adjacent spaced first features, the laterally separating forming an elevationally outermost region comprising one of the immiscible materials which covers an elevationally innermost region comprising another of the immiscible materials, the elevationally outermost and innermost regions having a curved interface there-between;
after the laterally separating, removing from between adjacent spaced first features one of a) a laterally intermediate region of the two immiscible materials, or b) laterally outer regions of the two immiscible materials that are laterally outward of the laterally intermediate region, to form spaced second features over the substrate;
the interface being curved elevationally inward;
the elevationally outermost region comprises the one immiscible material and the elevationally innermost region comprises the another immiscible material; and
the removing is of the laterally intermediate region, the removing comprising:
  removing all of the elevationally outermost region inwardly to expose an elevationally inward curving outer surface of the elevationally innermost region; and
  after removing all of the elevationally outermost region, removing the another immiscible material of the elevationally innermost region elevationally inward to the substrate to form remnant of the laterally outer regions to be spaced from one another.

* * * * *